(12) United States Patent
Fujita

(10) Patent No.: US 9,453,860 B2
(45) Date of Patent: Sep. 27, 2016

(54) INVERTER DEVICE

(71) Applicant: Masakazu Fujita, Kanagawa (JP)

(72) Inventor: Masakazu Fujita, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/795,184

(22) Filed: Jul. 9, 2015

(65) Prior Publication Data
US 2016/0020704 A1 Jan. 21, 2016

(30) Foreign Application Priority Data

Jul. 18, 2014 (JP) ................. 2014-147762

(51) Int. Cl.
| | | |
|---|---|---|
| H02M 7/539 | (2006.01) | |
| G01R 19/04 | (2006.01) | |
| H02M 7/537 | (2006.01) | |
| H02M 3/335 | (2006.01) | |
| H02M 1/00 | (2006.01) | |
| G01R 31/42 | (2006.01) | |

(52) U.S. Cl.
CPC .............. *G01R 19/04* (2013.01); *H02M 7/537* (2013.01); *G01R 31/42* (2013.01); *H02M 3/33523* (2013.01); *H02M 2001/0019* (2013.01)

(58) Field of Classification Search
CPC .................. H02M 7/42; H02M 7/48; H02M 2007/4815; H02M 2007/4818; H02M 7/53; H02M 7/537; H02M 7/539; H02M 7/5395; H02M 1/4241; Y02B 70/1416; Y02B 70/1441
See application file for complete search history.

(56) References Cited

U.S. PATENT DOCUMENTS

| | | | | |
|---|---|---|---|---|
| 5,424,933 A | * | 6/1995 | Illingworth | ....... H02M 3/33546 363/21.02 |
| 6,831,846 B2 | * | 12/2004 | Yasumura | ........... H02M 3/3385 363/21.02 |
| 8,125,798 B2 | * | 2/2012 | Huynh | .................. H02M 3/335 363/147 |
| 8,884,551 B2 | * | 11/2014 | Ling | ................. H02M 3/33507 315/297 |
| 2007/0195560 A1 | | 8/2007 | Yasumura | |
| 2011/0235382 A1 | | 9/2011 | Kamata | |
| 2012/0163058 A1 | | 6/2012 | Kamata | |
| 2012/0236614 A1 | | 9/2012 | Kamata | |
| 2014/0265911 A1 | | 9/2014 | Kamata et al. | |
| 2014/0268966 A1 | | 9/2014 | Kamata | |

FOREIGN PATENT DOCUMENTS

| | | |
|---|---|---|
| JP | 2007-049864 | 2/2007 |
| JP | 2007-189779 | 7/2007 |
| JP | 2007-236010 | 9/2007 |
| JP | 2012-191828 | 10/2012 |
| JP | 2013-031338 | 2/2013 |

* cited by examiner

*Primary Examiner* — Gary L Laxton
(74) *Attorney, Agent, or Firm* — Oblon, McClelland, Maier & Neustadt, L.L.P.

(57) ABSTRACT

An inverter device includes: a simulation output voltage generation unit that generates a simulation output voltage that corresponds to an instantaneous value of an alternating current output voltage and that has a waveform whose peak value is smaller than a peak value of the output voltage; a circuit that generates a peak value detection voltage by rectifying and smoothing the simulation output voltage; and a monitor circuit that compares the peak value detection voltage, or a voltage obtained by dividing the peak value detection voltage, with a reference voltage and transmits a feedback signal according to the result of the comparison to the control circuit. The control circuit changes a duty ratio of a switching signal for performing on/off control on the switching element in accordance with the feedback signal and controls the peak value detection voltage to keep a given value.

7 Claims, 4 Drawing Sheets

INVERTER DEVICE

CROSS-REFERENCE TO RELATED APPLICATIONS

The present application claims priority to and incorporates by reference the entire contents of Japanese Patent Application No. 2014-147762 filed in Japan on Jul. 18, 2014.

BACKGROUND OF THE INVENTION

1. Field of the Invention

The present invention relates to an inverter device.

2. Description of the Related Art

Switching regulators and inverter devices are used in order to supply high voltages to various devices, such as discharge tubes for large plasma displays and plasma generation apparatuses.

For example, atmospheric-pressure plasma is applied to various industrial products as a means for surface processing for, for example, modifying the surface or removing contaminants. When adhesion of, for example, a resin, printing, or coating is performed, pre-processing by atmospheric-pressure plasma makes it possible to increase the wettability.

Specifically, for example, when a print on which resin toner is printed by an electrophotographic image forming apparatus is to be coated with UV curing varnish, the wax components contained in the resin toner may repel the vanish on the printed resin toner.

The surface processing using atmospheric-pressure plasma increases the wettability and thus enables varnish coating, which increases the added values of prints. In order to generate atmospheric-pressure plasma, a high voltage is necessary and it is also necessary to efficiently apply a high voltage by using an inverter device and constantly supply the radical species thus generated to a load.

In general, while many inverter devices whose output power value is about a few watts are used, for plasma generation apparatuses, high voltage inverter devices whose output voltage is a few tens of kilovolts and whose power value is a few tens of watts are used.

In a general switching regulator (AC-DC or DC-DC converter), a switching element switches a direct current voltage to intermittently apply it to a primary excitation winding of a voltage transformer. An alternating current output generated at a secondary output winding is rectified and smoothed and a direct current voltage is output. In order to keep the output voltage at a constant voltage, the output voltage is detected, a feedback voltage is generated, and, according to the feedback voltage, pulse-width modulation (PWM) control for controlling the duty ratio (the on-time ratio in a period) of the switching element is performed.

The PWM control controls the output voltage to keep it constant by increasing the on-width of a switching pulse to compensate the output power shortage when the output voltage lowers, and by reducing the on-width to limit the excessive output power when the output voltage increases on the other hand.

However, because the output from the inverter device is an alternative current, it is difficult to control the peak value (peak voltage value) to keep it constant regardless whether it is a half wave or a full wave.

This is because the peak time comes at one point, and also because there is a control delay and, as the frequency at which the output voltage waveform is repeated increases, the effect of the delay becomes greater and accordingly the peak voltage excessively lowers or increases.

When the output is an alternating current and the switching frequency is high at a few tens of kilohertz and the peak voltage of the output is also high at a few tens of kilovolts, a problem of pressure resistance of an output voltage detection unit and parts occurs in addition to the above-described problem of control responsiveness. For this reason, in general, such a high voltage inverter device only controls the input supply voltage to keep it constant and does not control the output voltage value.

However, needless to say, to the device that uses the output voltage of the inverter device, it is preferable that the peak value of the output voltage does not fluctuate.

In order to meet such a demand, Japanese Laid-open Patent Publication No. 2013-31338 proposes that, in a high voltage inverter device whose output is an alternating current and its peak voltage is high at, for example, a few tens of kilowatts, the peak voltage is controlled to be kept constant.

The inverter device according to Japanese Laid-open Patent Publication No. 2013-31338 uses, as a monitor voltage, a voltage that is generated between the terminals of a switching element that switches the excitation current to a transformer or both ends of an excitation winding. A control signal is generated for controlling the period during which the switching element is on according to the peak value of the monitor voltage from the time at which the half wave of the monitor voltage in an off period of the switching element ends until just before the second peak wave of a resonance voltage appears. The on/off of the switching element is controlled in a way that the pulse width of a switching pulse of a square wave pulse signal having a constant frequency is modulated to change the ratio of the period during which the switching element is on according to the control signal and the switching pulse is output.

In this manner, to the output of an alternating current high voltage whose peak voltage is a few tens of kilovolts from an inverter device, it is possible to control the peak voltage to some extent.

The monitor voltage is, however, a voltage that is generated between both terminals of a switching device that switches the excitation current to a primary transformer or both ends of an excitation winding, and thus it is not possible to accurately detect a fluctuation in the output voltage due to, for example, a fluctuation at a load and perform feedback control.

Therefore, it is desirable to, in an inverter device that outputs an alternating current and its peak voltage is a few tens of kilovolts, enable fast feedback control by accurately detecting a fluctuation in the output voltage due to, for example, a fluctuation at a load, thereby keeping the peak value of the output voltage constant.

SUMMARY OF THE INVENTION

It is an object of the present invention to at least partially solve the problems in the conventional technology.

According to an aspect of the present invention, there is provided an inverter device that switches an input voltage by using a switching element on which on/off control is performed by a control circuit, flows an excitation current into an excitation winding of a resonance transformer during a period in which the switching element is on, and outputs an alternating current output voltage from an output winding of the resonance transformer during a period in which the switching element is off, the inverter device including: a simulation output voltage generation unit that generates a simulation output voltage that corresponds to an instantaneous value of the output voltage and that has a waveform whose peak value is smaller than a peak value of the output voltage; a circuit that generates a peak value detection voltage by rectifying and smoothing the simulation output voltage; and a monitor circuit that compares the peak value detection voltage, or a voltage obtained by dividing the peak value detection voltage, with a reference voltage and transmits a feedback signal according to the result of the comparison to the control circuit, wherein the control circuit changes a duty ratio of a switching signal for performing on/off control on the switching element in accordance with the feedback signal and controls the peak value detection voltage to keep a given value.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary Plasma Generation Apparatus Using Inverter Device

Before an embodiment for carrying out the present invention is described, an exemplary plasma generation apparatus using an inverter device serving as the foundation of the invention will be described.

Figure 6:
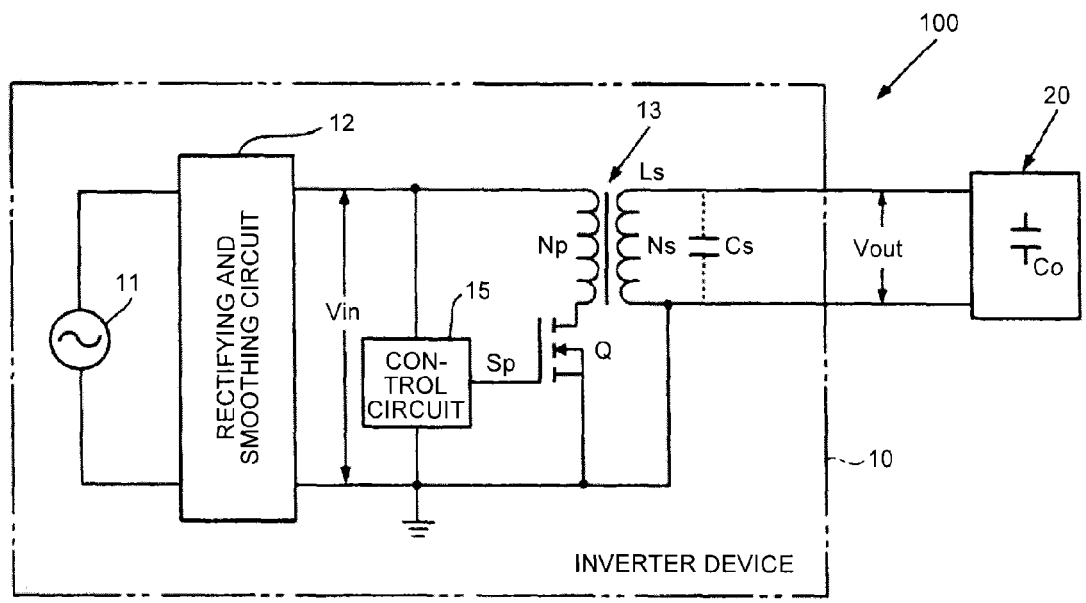
FIG. 6 is a circuit diagram showing a simplified exemplary plasma generation apparatus using an inverter device serving as the foundation of the invention.
Figure 7:
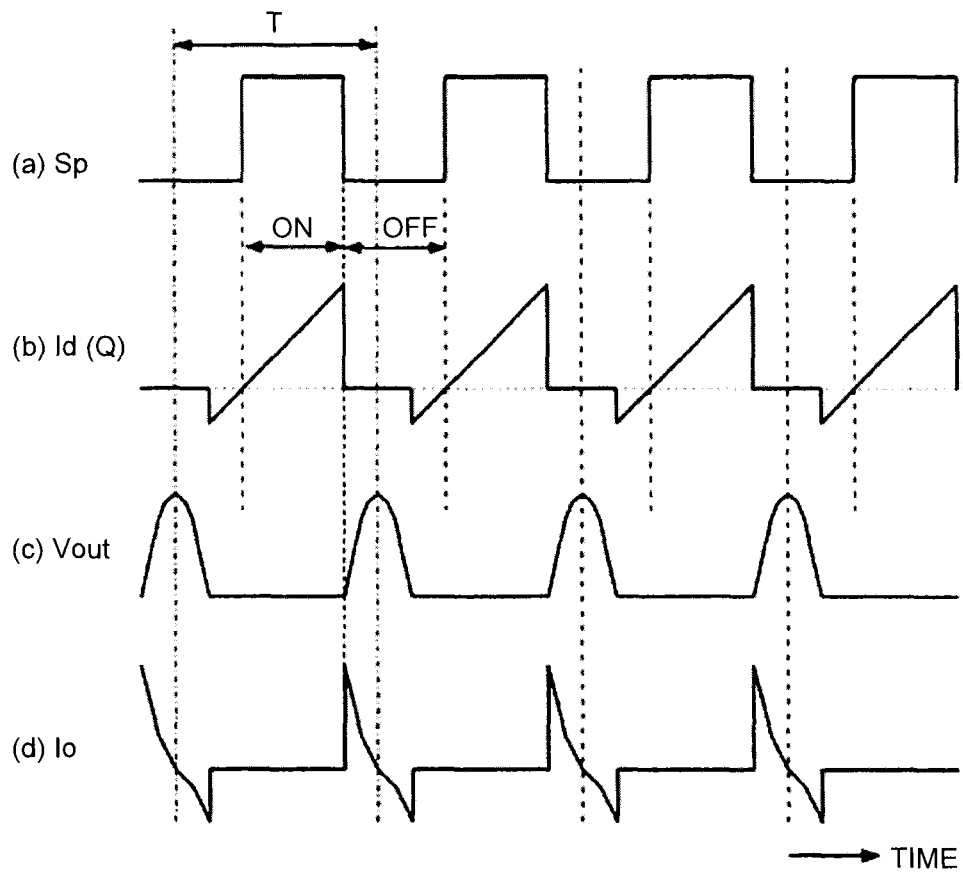
FIG. 7 is a waveform diagram showing the voltages and current waveforms at each unit of the inverter device shown in FIG. 6.

FIG. 6 is a circuit diagram showing a simplified exemplary plasma generation device, and FIG. 7 is a waveform diagram showing the voltages and current waveforms at each unit of the inverter device.

The plasma generation apparatus 100 shown in FIG. 6 includes an inverter device 10 and a discharge unit 20 that is a load of the inverter device 10.

The inverter device 10 includes a rectifying and smoothing circuit 12 that rectifies and smoothes an alternating current voltage from a commercial power supply 11 and a resonance transformer 13 using, as an input voltage Vin, a direct current voltage (that may contain pulsating current components) that the rectifying and smoothing circuit 12 outputs. The inverter device 10 further includes a switching element Q, for which, for example, an FET is used, and a control circuit 15 that controls the switching element Q.

The resonance transformer 13 includes an excitation winding Np and an output winding Ns. The excitation winding Np is connected in series to the switching element Q and is connected to a power supply circuit from the rectifying and smoothing circuit 12. According to a switching signal Sp that is output by the control circuit 15 to the gate terminal, on/off of the switching element Q is controlled.

The switching signal Sp that is applied from the control circuit 15 to the gate of the switching element Q is a square wave in a period T as shown in FIG. 7($a$) that has a waveform of a source-drain voltage Vgs(Q) of the switching element Q. The period in which the switching signal Sp is at a low level corresponds to an off-period and the period in which the switching signal Sp is at a high level corresponds to an on-period.

The inverter device 10 is a flyback voltage resonance inverter. Accordingly, the switching element Q switches the input voltage Vin to switch on/off the excitation current to be flown into the excitation winding Np of the resonance transformer 13. The excitation current is flown into the excitation winding Np during the on-period to store the excitation energy and an output voltage Vout having the waveform shown in FIG. 7($c$) is output from the output winding Ns of the resonance transformer 13 and is applied between the electrodes of the discharge unit 20 that is the load.

FIG. 7($b$) shows the drain current of the switching element Q, i.e., a current Id(Q) that flows into the switching element Q. FIG. 7($b$) shows the waveform of the excitation current that flows into the excitation winding Np of the resonance transformer 13. FIG. 7($d$) shows a waveform of an output current Io that flows into the discharge unit 20.

The output voltage Vout is generated by a series resonance circuit using an inductance Ls of the output winding Ns and a synthetic capacity of a distribution capacity Cs of the output winding Ns and an equivalent electrostatic capacity (load capacity) Co of the discharge unit 20 that is a load.

The output voltage is a high voltage corresponding to the winding ratio between the excitation winding Np and the output winding Ns. Thus, the waveform of the output voltage Vout has approximately a half wave of a sin wave as shown in FIG. 7($c$) that is, in this example, a positive (+) voltage corresponding to a positive half wave. Alternatively, it may be a negative (−) voltage corresponding to a negative half wave.

The control circuit 15 performs pulse width modulation (PWM) control on the switching signal Sp to change the ratio (duty ratio) of the on-period to one period T, thereby controlling the output voltage Vout. It is also possible to change the frequency of the switching signal SP and the period.

Figure 8:
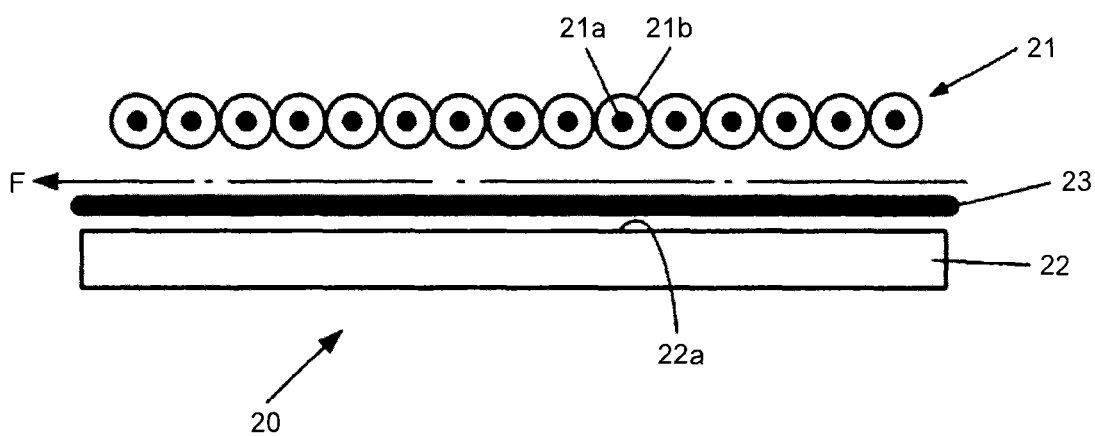
FIG. 8 is a schematic side view of an exemplary configuration of a discharge unit that is a load of the inverter device shown in FIG. 6.

For example, as shown in FIG. 8, the discharge unit 20 includes a discharge electrode 21, a counter electrode 22 opposed to the discharge electrode 21, and a dielectric 23 between the discharge electrode 21 and the counter electrode 22.

In this example, multiple (15 in the example shown in FIG. 8) round-rod-shaped discharge electrodes 21 in each of which a conductive metal wire 21a made of, for example, copper or aluminum, is covered with an insulator (dielectric) 21b form a series of discharge electrodes. In other words, the multiple discharge electrodes 21 are arranged so as to extend in a direction orthogonal to the surface of the drawing on a plane parallel to an opposed surface 22a of the platy counter electrode 22 such that the circumferences of adjacent electrodes make a contact with each other in the horizontal direction shown in FIG. 8. The diameter (φ) of each discharge electrode 21 is, for example, about 8 mm.

The counter electrode 22 is a flat platy electrode, for which a conductive metal, such as copper or aluminum is used, and also serves as a heat sink. The opposed surface 22a of the counter electrode 22 opposed to the discharge electrode 21 is coated with the dielectric 23, such as a silicone sheet. According to FIG. 8, there is a space between the counter electrode 22 and the dielectric 23 to distinguish them, but they practically adhere to each other with, for example, an adhesive.

An interval is shown also between the discharge electrode 21 and the dielectric 23, but practically it suffices if there is a space through which a sheet-shaped recording material, such as printing paper, having a surface to be modified can pass in the direction denoted by the arrow in a dashed line.

The above-described high voltage Vout of 6 kV or larger from the inverter device 10 is applied between each discharge electrode 21 and the counter electrode 22 configured as described above. This makes it possible to cause a creeping discharge (streamer discharge) or a silent discharge that is one type of atmospheric pressure plasma electric discharge, or cause a dielectric barrier discharge depending on a composite flash of creeping discharge and silent discharge. Alternatively, a corona discharge may be caused in the atmosphere.

The counter electrode 22 is grounded. The effects of the voltage applied to the discharge electrode 21 do not differ even if the polarity is reversed.

By conveying the sheet-shaped recording material as represented with the arrow in a dashed line to cause the recording material to pass through the discharge unit 20, the surface of the recording material makes a contact with the active species, such as radicals and ions generated by the dielectric barrier discharge described above, and the modifying proceeds. The modifying proceeds because the plasma forms bases, such as various hydrophilic functional groups, formed of components contained in the components of the air or in the recording material, on the surface of the recording material and accordingly the surface energy increases. For example, when the surface of the recording material contains a waterproof part, the waterproof part is hydrophilized so that the surface is modified.

The configuration of the discharge unit is not limited to this, and it can be changed into various configurations according to the use.

In general, it is said that such an atmospheric-pressure plasma discharge occurs at 6 kV or larger at a normal pressure. The load between the two electrodes is a load capacity Co of a passive element of the discharge unit 20 and the capacity of the resonance circuit at the secondary winding of the resonance transformer 13 shown in FIG. 6 is a synthetic capacity of the load capacity Co and the distribution capacity Cs of the output winding Ns. Accordingly, the resonance constants of the above-described resonance circuit are Ls, Cs and Co described above.

Because a strong magnetic field is applied to the electric path and the resonance constants fluctuates due to the temperature and a variance between the lengths between lines, the output voltage waveform of the inverter device 10 includes not only a basis wave and is a distorted output waveform. For this reason, when Fourier expansion is performed, it is dissolved into a voltage waveform that alternates at a high degree and attenuates.

The output voltage Vout is an alternated voltage of a few kilovolts or a few tens of kilovolts, and an average output power is in a range of a few watts or a few tens of watts.

When the output voltage has a basic wave for which $Vout(t)=\sqrt{2}Vout \cdot \sin(\omega t)$, it is on a function of a sin wave, where Vout is the effective value of the output voltage value.

Practically, the alternated output voltage has a waveform successive at a high degree as described above; however, the simplified waveform of the output voltage Vout, i.e., only a basic wave, is purposely shown in FIG. 7(c).

When the exciting energy to be applied to the resonance transformer 13 is insufficient, it is not possible to extract the intended output power. The magnetic energy to be applied is proportional to the square of the voltage applied to the excitation winding Np of the resonance transformer 13 and the time of excitation.

For this reason, it is necessary to increase the ratio of the excitation time to a period in order to increase the output voltage; however, if the time of excitation is unnecessarily increased, a voltage unnecessarily high with respect to the use is output as the output voltage.

For this reason, it is preferable to control the peak value of the alternated output voltage in the inverter device to keep the peak value at a constant value corresponding to the use without time lag.

The inverter device according to the present invention accurately detects a fluctuation in the output voltage due to, for example, a fluctuation at the load in real time, to perform fast feedback control and controls the peak value of the output voltage to constantly keep the peak value at a constant value.

Embodiment of Invention

An embodiment of the inverter device according to the invention will be described with reference to FIGS. 1 to 5.

Figure 1:
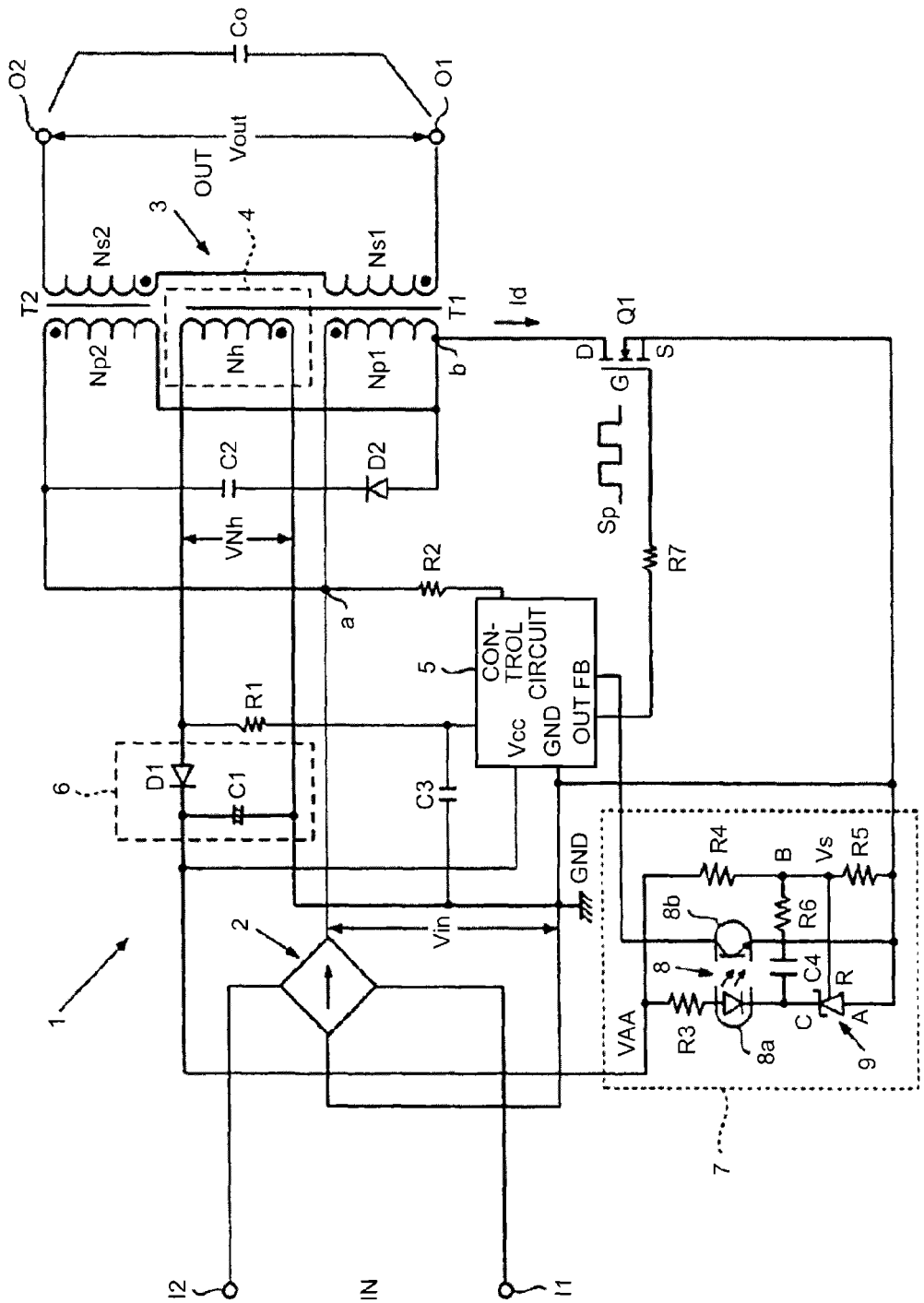
FIG. 1 is a circuit diagram showing an embodiment of an inverter device according to the present invention.

FIG. 1 is a circuit diagram showing an embodiment of the inverter device. If, for example, the discharge unit 20 shown in FIG. 8 is connected as a load of an inverter device 1, it is possible to configure the plasma generation apparatus.

The basic configuration of the inverter device 1 shown in FIG. 1 is in that it includes, as the inverter device 10 shown in FIG. 6 does, a resonance transformer 3, a switching element Q1 that switches on/off the excitation current, and a control circuit 5 that controls on/off of the switching element Q1.

As the switching element Q1, a field effective transistor (FET) is used.

The control circuit 5 is a semiconductor integrated circuit (IC) that outputs a switching signal Sp of a square wave pulse having a frequency of 15 to 20 kHz to a gate terminal G of the switching element Q1 to control the on/off of the switching element Q1 by PWM. The feedback control according to the invention is also performed, which will be described below.

The inverter device 1 further includes a full-wave rectifier circuit 2 that performs full-wave rectification on an alternating current of a commercial power supply that is input from the input terminals I1 and I2 to generate an input voltage Vin of a pulsating current. It is preferable that the voltage from the full-wave rectification be smoothed by a smoothing circuit including a resistor or a choke coil and a smoothing capacitor to generate an input voltage Vin of a direct current, but it is not shown in the drawing. In general, the input voltage Vin is a direct current voltage or a voltage in which the pulsating flow is superimposed onto the direct current components.

According to the embodiment, the resonance transformer (step-up transformer) 3 includes multiple, i.e., two in this case, transformers T1 and T2 having the same characteristics and having separate cores (magnetic paths). Excitation windings Np1 and Np2 that serve as primary windings and excitation windings Ns1 and Ns2 that serve as secondary windings are wounded around the cores of the transformers T1 and T2.

The excitation windings Np1 and Np2 of the transformers T1 and T2 are connected in series, and the switching element Q on which the control circuit 5 performs on/off control switches the input voltage Vin (DC), which is obtained from the full-wave rectification by the full-wave rectifier circuit 2, to flow an excitation current concurrently during the on-period. Accordingly, the energy is stored in the transformers T1 and T2.

During the off-period of the switching element Q, the time axes of the waveforms of the voltages that are induced at the output windings Ns1 and Ns2 by the energy stored in the transformers T1 and T2 are synchronized. The output windings Ns1 and Ns2 are connected in series and the high output voltage Vout having an alternating current half waveform obtained by superimposing the output voltages is output to the load from between the output terminals O1 and O2. The larger the value Q representing the sharpness of resonance at the transforms T1 and T2 is, the more the output voltage Vout can be increased.

The input voltage Vin, which is obtained from the full-wave rectification by the full-wave rectifier circuit 2, to the resonance transformer 3 is applied between the ground GND and a connection point a of one of the excitation windings Np1 and Np2 of the transformers T1 and T2. Another connection point b of the other of the excitation windings Np1 and Np2 is connected to the drain terminal D of the switching element Q1 and the source terminal S of the switching element Q1 and the ground terminal of the control circuit 5 are also connected to the ground GND. The connection point a is connected to the power terminal of the control circuit 5 via a resistor R2.

Accordingly, the input voltage Vin serves as a power supply voltage for flowing the excitation current into the resonance transformer 3 and as a power voltage for causing the control circuit 5 to operate.

The transformer T1 of the resonance transformer 3 has, in addition to the excitation winding Np1 and the output winding Ns1, a feedback winding Nh (referred to as a third winding or an auxiliary winding) wound around the same core.

At the feedback winding Nh, during the period in which the switching element Q1 is off (off-period), a simulation output voltage VNh is generated in synchronization with the output voltage Vout of the alternating current half-waveform that is generated at the series circuit of the output windings Ns1 and Ns2. The simulation output voltage VNh is a flyback voltage corresponding to the instantaneous value of the output voltage Vout and having a waveform whose peak value is smaller than the peak value of the output voltage Vout. The feedback winding Nh of the transformer T1 is thus a simulation output voltage generation unit 4.

The number of turns of the feedback winding Nh is significantly smaller than the number of turns of the output winding Ns1. In other words, the number of turns of the feedback winding Nh is at least 1/100 of the number of turns of the output winding Ns1 or smaller, and it is more preferable that it be about 1/1000 of the number of turns of the output winding Ns1.

Accordingly, while the simulation output voltage VNh generated at the feedback winding Nh has a waveform corresponding to the output voltage Vout, the simulation output voltage VNh has a peak value that is 1/100 of the peak value of the output voltage Vout or smaller and preferably has a peak value that is 1/1000 of the peak value of the output voltage Vout or smaller even if the output voltage Vout corresponds to a high voltage or an extra-high voltage. The peak value voltage of the simulation output voltage VNh in that case is about a few volts to a few tens of volts (preferably, about 10 V). The "simulation output voltage" may be referred to as a "similar voltage to the output voltage" or a "feedback voltage".

The "high voltage" refers to a voltage whose peak voltage is 600 V to 7 kV and the "extra-high voltage" refers to a voltage whose peak voltage exceeds 7 kV.

The simulation output voltage VNh is rectified and smoothed by a rectifying and smoothing circuit 6 including a diode D1 and a smoothing capacitor C1 to generate a peak value detection voltage VAA according to the peak value of the simulation output voltage VNh, and the peak value detection voltage VAA is input to a monitor circuit 7. The rectifying and smoothing circuit 6 is a circuit that rectifies and smoothes the simulation output voltage to generate a peak value detection voltage.

The simulation output voltage VNh is also input to the control circuit 5 via the resistor R1 and the capacitor C3 is connected between the input terminal of the control circuit 5 and the ground GND. The peak value detection voltage VAA that is output from the rectifying and smoothing circuit 6 is also input to the Vcc terminal of the control circuit 5.

The simulation output voltage VNh is input to the control circuit 5 in order to detect the zero crossing of the output voltage Vout at the control circuit 5. For example, the simulation output voltage VNh is compared to a reference voltage in the control circuit 5 and, when the simulation output voltage VNh becomes lower than the reference voltage, it is determined that it is at the zero-crossing. The capacitor C3 is a capacitor for removing noise.

The monitor circuit 7 includes a photocoupler 8 in which a light-emitting element 8a, such as a photodiode, and a light-receiving element 8b, such as a phototransistor, are disposed to be opposed to each other in a package, a shunt regulator 9 having three terminals, resistors R3 to R6, and a capacitor C4.

Between the line for supplying the feedback voltage VAA and the ground line, a series circuit of a protective resistor R3, the light-emitting element 8a of the photocoupler 8, and cathode and anode terminals (C-A) of the shunt regulator 9 and a series circuit of resistors R4 and R5 for voltage division are connected in parallel.

The monitor circuit 7 applies, to a reference terminal R of the shunt regulator 9, a divided voltage Vs that is obtained from division of the peak value detection voltage VAA by the resistors R4 and R5. A phase compensation circuit including the resistor R6 and the capacitor C4 is connected between a point B of the voltage division by the resistors R4 and R5 and a cathode terminal C of the shunt regulator 9.

A feedback terminal FB of the control circuit 5 is connected to the ground GND via the light-receiving element 8b of the photocoupler 8.

Figure 2:
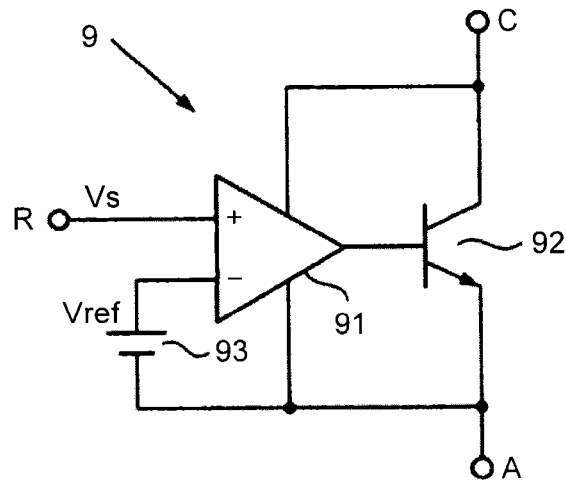
FIG. 2 is a circuit diagram of the configuration of the shunt regulator used in the monitor circuit shown in FIG. 1.

The shunt regulator 9 is a known device and, as shown in FIG. 2, includes an error amplifier 91, for which an operation amplifier is used, a transistor (shunt transistor) 92, and a reference power supply 93. The positive input terminal of the error amplifier 91 is a reference terminal R and a reference voltage Vref (of, for example, 1.25 V or 2.5 V) from the reference power supply 93 is applied to the negative input terminal. The output terminal of the error amplifier 91 is connected to the base of the transistor 92 and the emitter and the collector of the transistor 92 respectively serve as an anode terminal A and a cathode terminal C.

The reference power supply 93 is an internal power supply that constantly outputs a constant reference voltage Vref corresponding to the target value of the divided voltage Vs of the peak value detection voltage VAA, and, for example, a cell is used for the reference power supply 93.

The shunt regulator 9 is used in a manner that the anode terminal A is connected to the ground GND and the cathode terminal C is connected to the power supply via the load. The error amplifier 91 compares the voltage that is input to the reference terminal R to the reference voltage Vref and changes the base potential according to the result of the comparison to control the collector current, i.e., the load current.

In the monitor circuit 7 shown in FIG. 1, the cathode terminal C and the anode terminal A of the shunt regulator 9 are connected in series to the resistor R3 and the light-emitting element 8a of the photocoupler 8 between the line for supplying the peak value detection voltage VAA and the ground line. The divided voltage Vs from division of the peak value detection voltage VAA by the resistors R4 and R5 is applied to the reference terminal R.

The peak value detection voltage VAA may be directly applied to the reference terminal R of the shunt regulator 9, and it is preferable that, when the peak value detection voltage VAA is at a given value, the peak value detection voltage VAA be divided to a voltage that equals to the reference voltage Vref and the voltage be applied. The peak value detection voltage VAA at the given value corresponds to the peak value of the output voltage Vout at a set value.

In the monitor circuit 7, when the divided voltage Vs is under the reference voltage Vref (Vs<Vref), the output voltage at the error amplifier 91 of the shunt regulator 9 lowers and the collector current to the transistor 92 decreases. The current that flows into the light-emitting element 8a of the photocoupler 8 thus reduces and accordingly the luminance thus lowers and the resistance value of the light-receiving element 8b increases, so that the voltage at the feedback terminal FB (FB voltage) of the control circuit 5 increases.

Figure 3:
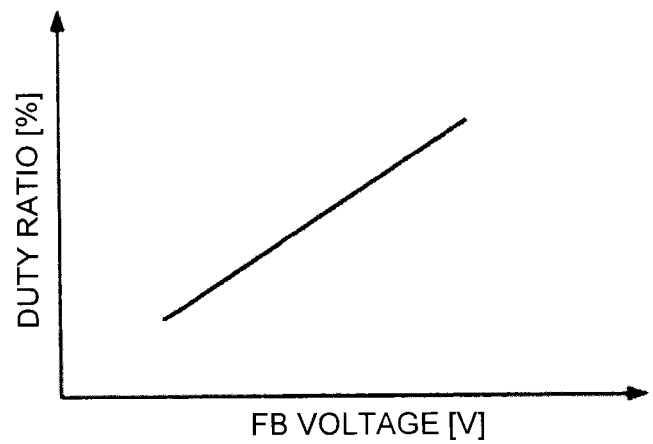
FIG. 3 is a line diagram showing the relation between the voltage (FB voltage) at a feedback terminal of the control circuit shown in FIG. 1 and the duty ratio of a switching signal.

The FB voltage at the control circuit 5 and the duty ratio of the switching signal Sp (the ratio of the on-period to one period, which is also referred to as "on-duty") have a proportional relation as shown in FIG. 3. For this reason, when the FB voltage increases, the control circuit 5 increases the duty ratio of the switching signal Sp and accordingly the ratio of the period in which the excitation current flows into the resonance transformer 3 increases, which increases the peak value of the output voltage Vout.

When the divided voltage Vs is over the reference voltage Vref (Vs>Vref), the output voltage at the error amplifier 91 of the shunt regulator 9 increases and the collector current to the transistor 92 increases. Accordingly, the current that flows into the light-emitting element 8a of the photocoupler 8 increases and thus the luminance increases and the resistance value of the light-receiving element 8b reduces, so that the voltage of the feedback terminal FB of the control circuit 5 (FB voltage) lowers. Accordingly, the control circuit 5 reduces the duty ratio of the switching signal Sp (see FIG. 3) and thus the ratio of the period in which the excitation current flows into the resonance transformer 3 reduces, which lowers the peak value of the output voltage Vout.

When the divided voltage Vs equals to the reference voltage Vref (Vs=Vref), because the output voltage of the error amplifier 91 of the shunt regulator 9 and the collector current of the transistor 92 do not change, the luminance of the light-emitting element 8a of the photocoupler 8 does not change. Thus, the resistance value of the light-receiving element 8b does not change and the voltage of the feedback terminal FB of the control circuit 5 keeps the voltage at that time. For this reason, without changing the duty ratio of the switching signal Sp, the control circuit 5 keeps the peak value of the output voltage Vout even during the period in which the excitation current flows into the resonance transformer 3.

When the peak value of the output voltage Vout lowers because of the feedback control, the peak value of the simulation output voltage VNh that is generated at the feedback winding Nh of the transformer T1 also lowers and the peak value detection voltage VAA also lowers. Accordingly, the divided voltage Vs lowers to be close to the reference voltage Vref.

On the contrary, when the peak value of the output voltage Vout increases, the peak value of the simulation output voltage VNh that is generated at the feedback winding Nh of the transformer T1 also increases and the peak value detection voltage VAA also increases. The divided voltage Vs increases to be, also in this case, close to the reference voltage Vref.

When the peak value of the output voltage Vout does not change, both the peak value detection voltage VAA and the divided voltage Vs thereof do not change and the divided voltage equals to the reference voltage Vref.

In this manner, according to the embodiment, in the shunt regulator 9 of the monitor circuit 7, the error amplifier 91 compares the divided voltage Vs obtained by diving the peak value detection voltage VAA to the reference voltage Vref. The shunt regulator 9 then generates a feedback signal according to the result of the comparison as a change in the collector current to the transistor 92. The feedback signal generated by the shunt regulator 9 is transmitted to the control circuit 5 via the photocoupler 8.

According to the voltage at the feedback terminal FB (the FB voltage) from the feedback signal that is transmitted from the monitor circuit 7, the control circuit 5 changes the duty ratio of the switching signal Sp for performing on/off control on the switching element Q1. In this manner, PWM control is performed during the on-period of the switching element Q1 such that the divided voltage Vs equals to the reference voltage Vref, i.e., the peak value detection voltage VAA keeps the given value, to control the output voltage Vout to keep it at a desired constant value.

Accordingly, the inverter device according to the invention is capable of performing fast feedback control by accurately detecting a fluctuation in the output voltage due to, for example, a fluctuation at the load and capable of constantly keeping the peak value of the output voltage constant.

For this reason, by configuring a plasma generation apparatus using the inverter device according to the invention as a power supply, it is possible to cause a streamer discharge, such as a sequential and uniform dielectric barrier discharge, and generate active species, such as radicals and ions. Modifying the surface of a medium, such as paper, by using the active species can increase the effect of the modification.

Figure 4:
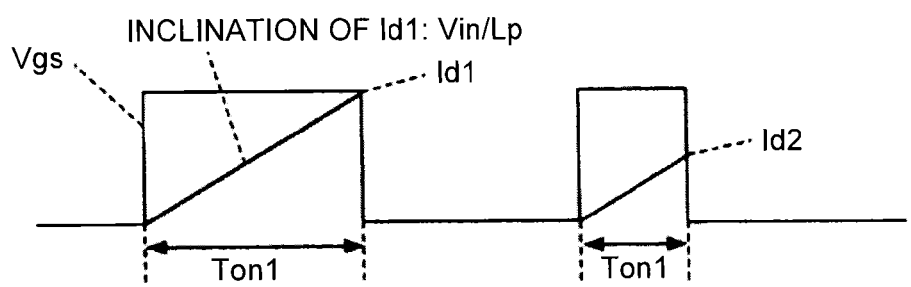
FIG. 4 is a diagram for explaining the relation between the on-period of the switching element in the inverter device shown in FIG. 1 and a drain current.

FIG. 4 is a diagram for explaining the relation between the on-period of the switching element in the inverter device shown in FIG. 1 and the drain current (corresponding to the excitation current of the resonance transformer 3).

Figure 5:
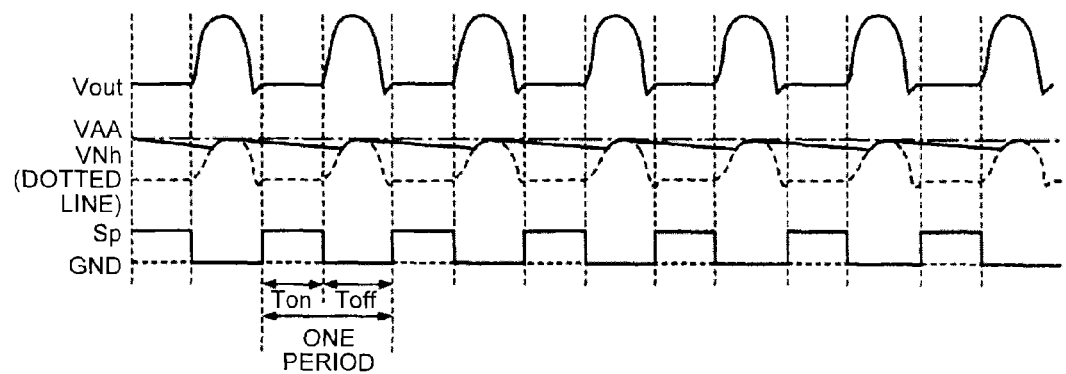
FIG. 5 is a timing-waveform diagram showing the relation among an output voltage Vout, a simulation output voltage VNh, a peak value detection voltage VAA, and a switching signal Sp in the inverter device shown in FIG. 1.

FIG. 5 is a timing-waveform diagram showing the relation among the output voltage Vout, the simulation output voltage VNh, the peak value detection voltage VAA, and the switching signal Sp in the inverter device shown in FIG. 1.

In FIG. 4, Vgs denotes the gate-source voltage at the switching element Q1, Id (Id1 and Id2) denote a drain current to the switching element Q1 corresponding to the excitation current to the resonance transformer 3, and Ton (Ton1 and Ton2) denotes the on-period of the switching element Q1.

Excitation currents corresponding to Id/2 concurrently flow into the excitation winding Np1 of the transformer T1 and the excitation winding Np2 of the transformer T2, respectively.

In general, when is supposed that LP is the excitation inductance of the resonance transformer 3, from Vin(t)=Lp·i(t)/dt according to Faraday's law, the inclination of Id during a very short time is a differential coefficient.

$$Id=(Vin/Lp) \cdot Ton \quad (1)$$

Because the excitation inductance Lp is a constant, Id ∝ Vin·Ton.

Because the excitation windings Np1 and Np2 of the two transformers T1 and T2 are connected in parallel in the resonance transformer 3, as for the excitation energy є to be applied to the resonance transformer 3,
∈=(Lp/2)·Id², and Id according to Equation (1) is substituted so that $$\in = (Vin \cdot Ton)^2/(2 \cdot Lp).$$

Accordingly, the excitation energy stored in the resonance transformer 3 is constant when the Vin and Ton are constant, and the output voltage Vout is controlled to be kept constant when there is no fluctuation at the load.

When the excitation inductance Lp of the resonance transformer 3 is constant, the drain current Id to the switching element Q1 corresponding to the excitation current is, as shown in FIG. 4, proportional to the on-period Ton of the switching element Q1. During the on-period Ton, the switching signal Sp is at a high level.

Here, when it is supposed that Id1 and Id2 denote the maximum values of the excitation current to the resonance transformer 3 at each period in a case where the on-period is Ton1 and Ton2 as shown in FIG. 4, they are calculated according to the following equations.

$$Id1=(Vin/Lp) \cdot Ton1$$

$$Id2=(Vin/Lp) \cdot Ton2$$

When Ton1>Ton2, Id1>Id2.

Because the excitation energy ∈ stored at the primary side of the resonance transformer 3 is proportional to Id, when it is supposed that ∈1 and ∈2 denote the energy stored at the primary side of the resonance transformer 3 when the maximum values of the excitation current to the resonance transformer 3 are Id1 and Id2, ∈1>∈2.

When it is supposed that the conversion efficiency of the resonance transformer 3=1 and the excitation energy ∈ stored at the primary side of the resonance transformer 3 is equal to the energy emitted to the secondary side, $$\in = (1/2) \cdot C \cdot Vout^2,$$

where Vout is an output voltage and C is the load capacity.

When the load capacity C is constant, the output voltage Vout is output in proportion to ∈.

For this reason, it is possible to adjust the output voltage Vout by adjusting the on-period Ton of the switching element Q1. The on-period Ton of the switching element Q1 is proportional to the on-duty of the switching signal Sp, i.e., the duty ratio.

The duty ratio corresponds to (Ton/T)×100[%], where T is the period of the switching signal Sp having the square-wave pulse waveform shown in FIG. 5 and Ton is the high-level period in which the switching element Q1 is on.

A simulation output voltage VNh having a voltage waveform whose peak is significantly smaller than that of the output voltage Vout shown at the upper stage in FIG. 5 is generated at the feedback winding Nh of the transformer T1 from the two transformers T1 and T2 that the above-described resonance transformer 3 includes. The simulation output voltage Vnh is represented by the dotted line at the middle stage in FIG. 5 and the peak value is shown in a larger magnitude for showing it in the drawing.

When it is supposed that K denotes a transformer coupling coefficient of the transformer T1, η denotes a transformer efficiency, and nNh and nNs1 denote the number of turns of the feedback winding Nh and the output winding Ns1, respectively, the following Equation (2) holds in a state without any loss.

$$nNh:nNs1=(VNh \cdot K \cdot \eta):(Vout/2) \cdot K \cdot \eta) \quad (2)$$

More specifically, when Ip1 is the excitation current (primary current) to the transformer T1, $$Ip1=(2*Ps)/((1+K)*\eta*Vin*Duty),$$

where Duty is the on-time ratio of the switching element Q1 (duty ratio) and K is a transformer coupling coefficient of the transformer T1 (because Ton is determined at the feedback winding, it is the magnetic coupling of Nh (feedback winding), Ns (output winding), and Np (excitation winding)), η is the transformer efficiency (that lowers according to the loss), and Ps is the total power that is output by the transformer T1 to the output winding Ns1 and the feedback winding Nh.

The following equation thus holds:

$$Nph=(Va*Toff)/(Vin*Ton)$$

where Nph is the ratio between the numbers of turns of the excitation winding Np1 and the feedback winding Nh; Va is the peak value of the simulation output voltage (flyback voltage) that is generated at the feedback winding Nh, i.e., VAA; Toff is the off-period (time) of the switching element Q1; and Ton is the on-period (time) of the switching element Q1.

The on-period Ton of the switching element Q1 and the coupling coefficient K of the transformer T1 are represented by the following equations:

$$Ton=(Va*T)/(Nph*Vin+Va), \text{ and}$$

$$K=1-(Vin*Ton)/(Ip*Lp),$$

where T is the time of one period and Lp is the excitation inductance of the transformer T1.

The inverter device 1 shown in FIG. 1 controls the peak value of the simulation output voltage (flyback voltage) VNh generated at the feedback winding Nh of the transformer T1 that the resonance transformer 3 includes, i.e., the peak value detection voltage VAA, to keep the peak value at the constant voltage. In this manner, he inverter device 1 controls the peal values of the flyback voltage (Vout/2) that is output to the output winding Ns1 that is magnetically coupled to the feedback winding Nh and the flyback voltage (Vout/2) that is output to the output winding Ns2 pf the transformer T2 and that is equivalent to the flyback voltage to the output winding Ns1. In other words, the peak value of the output voltage Vout is controlled to be kept at a set value.

Accordingly, the output fluctuation width depends on the magnetic coupling between the feedback winding Nh and the output winding Ns1 of the transformer T1. The output fluctuation width depends on the variation width of the output power from the output winding Ns1 of the transformer T1 and the variation width of the output power from the feedback winding Nh.

It is known, from the past experimental manufacturing, that the excitation winding Np1 (the primary winding) and the output winding Ns1 have a fluctuation of about 3%. From that fact, the excitation winding Np1 and the feedback winding Nh can be considered similarly and, when it is assumed that they have a fluctuation of about 3%, the fluctuation width between the output winding Ns1 and the feedback winding Nh at the transformer T1 is about 6%.

The load is a capacitive load. When it is assumed that the variation width of the capacity during the operation of the load is about 3% within the variation of the temperature in which the load is used (−5° C. to 100° C.), it is expected that the variation of the output voltage from the output winding Ns1 is also about 3%.

Accordingly, when the fluctuation between Np1 and Nh is 3%, the fluctuation between Np and Ns1 is 3%, and the fluctuation at the load is 3%, the fluctuation is 9% at most even when each factor fluctuates at the maximum. Thus, it is possible to sufficiently control the output voltage Vout according to the output voltage (simulation output voltage) VNh at the feedback winding Nh. However, there is a possibility that the output voltage Vout fluctuates within a range of 10.8 to 13.2 kv when the set value for the peak voltage of the output voltage Vout is 12 kV.

In order to keep the output fluctuation within the range, as described above, it is preferable to keep the transformer coupling coefficient K at 0.999 or more and keep the transformer efficiency η at 0.96 or more, thereby assuring that K·η that is the product of K and q is 0.95 or more.

In the inverter device 1 shown in FIG. 1, the variation in the output voltage Vout shown in FIG. 5 is detected as a variation in the simulation output voltage VNh from the feedback winding Nh of the transformer T1 per switching period (frequency of 20 to 30 kHz); however, a time of about 1 msec is necessary at shortest due to the effect of the rectifying and smoothing circuit 6 for generating the peak value detection voltage VAA and the following phase compensation circuit including the resistor R6 in the monitor circuit 7 after the rectifying and smoothing circuit 6 and the capacitor C4. Accordingly, the responsiveness in this case is about 1 kHz.

According to the above-descried embodiment, the feedback winding Nh is disposed at the transformer T1 that is one of the multiple transformers T1 and T2 that the resonance transformer 3 includes to configure the simulation output voltage generation unit that generates a feedback voltage as a simulation output voltage. The number of transformers that the resonance transformer 3 includes may be three or more.

Alternatively, a tap may be extracted from a part distant by few turns from one end of the output winding of a transformer that is one of multiple transformers that a resonance transformer includes and, from the part in between in the output winding, a simulation output voltage similar to that of the above-described example may be generated. In this case, a part of the output winding of the transformer also serves as a simulation output voltage generation unit.

When the resonance transformer includes one transformer, a feedback winding Nh is disposed at the resonance transformer to configure a simulation output voltage generation unit. Alternatively, a tap may be extracted from a part distant by few turns from one end of the output winding of the resonance transformer and the part in between may also serve as a simulation output voltage generation unit.

The modulation output voltage in these cases also corresponds to the instantaneous value of the output voltage from the output winding of the resonance transformer and is a voltage having a waveform whose peak value is smaller than the peak value of the output voltage (e.g., $\frac{1}{100}$ or smaller, more preferably, $\frac{1}{1000}$ or smaller).

For the above-described embodiment, the case has been described where the excitation windings of the multiple transformers that the resonance transformer includes are connected in parallel and the output windings are connected in series. Alternatively, the excitation windings of the multiple transformers that the resonance transformer has may be connected in series and the output windings may connected in parallel.

The inverter device according to the embodiment is capable of performing fast feedback control by accurately detecting a fluctuation in the output voltage due to, for example, a fluctuation at a load, thereby constantly keeping the peak value of the output voltage constant.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An inverter device that switches an input voltage by using a switching element on which on/off control is performed by a control circuit, flows an excitation current into an excitation winding of a resonance transformer during a period in which the switching element is on, and outputs an alternating current output voltage from an output winding of the resonance transformer during a period in which the switching element is off, the inverter device comprising:
    a simulation output voltage generation unit that generates a simulation output voltage that corresponds to an instantaneous value of the output voltage and that has a waveform whose peak value is smaller than a peak value of the output voltage;
    a circuit that generates a peak value detection voltage by rectifying and smoothing the simulation output voltage; and
    a monitor circuit that compares the peak value detection voltage, or a voltage obtained by dividing the peak value detection voltage, with a reference voltage and transmits a feedback signal according to the result of the comparison to the control circuit,
    wherein the control circuit changes a duty ratio of a switching signal for performing on/off control on the switching element in accordance with the feedback signal and controls the peak value detection voltage to keep a given value.

2. The inverter device according to claim 1, wherein the peak value of the simulation voltage is 1/100 of the peak value of the output voltage or smaller.

3. The inverter device according to claim 1, wherein the simulation output voltage generation unit generates the simulation output voltage by using a feedback winding that is disposed at the resonance transformer.

4. The inverter device according to claim 3, wherein
the resonance transformer includes a plurality of transformers having separate cores and having the same characteristics, and
the feedback winding is disposed at one of the plurality of transformers.

5. The inverter device according to claim 3, wherein, in the transformer at which the feedback winding is disposed, the product of a transformer coupling coefficient and a transformer efficiency is 0.95 or more.

6. The inverter device according to claim 1, wherein, by using a shunt regulator, the monitor circuit compares the peak value detection voltage, or the voltage obtained by dividing the peak value detection voltage, with the reference voltage and generates a feedback signal according to the result of the comparison.

7. The inverter device according to claim 6, wherein the monitor circuit transmits the feedback signal that is generated by using the shunt regulator to the control circuit via a photocoupler.

* * * * *